United States Patent
Hisamatsu et al.

(10) Patent No.: US 9,330,935 B2
(45) Date of Patent: May 3, 2016

(54) PLASMA ETCHING METHOD AND PLASMA ETCHING APPARATUS

(71) Applicant: TOKYO ELECTRON LIMITED, Tokyo (JP)

(72) Inventors: Toru Hisamatsu, Miyagi (JP); Masanobu Honda, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 18 days.

(21) Appl. No.: 14/074,020

(22) Filed: Nov. 7, 2013

(65) Prior Publication Data

US 2014/0134848 A1 May 15, 2014

Related U.S. Application Data

(60) Provisional application No. 61/727,200, filed on Nov. 16, 2012.

(30) Foreign Application Priority Data

Nov. 9, 2012 (JP) .................................. 2012-247782

(51) Int. Cl.
  *H01L 21/32* (2006.01)
  *H01L 21/311* (2006.01)
  *H01L 21/027* (2006.01)

(52) U.S. Cl.
  CPC ...... *H01L 21/31138* (2013.01); *H01L 21/0273* (2013.01); *H01L 21/31144* (2013.01); *H01J 2237/334* (2013.01)

(58) Field of Classification Search
  None
  See application file for complete search history.

(56) References Cited

U.S. PATENT DOCUMENTS

| | | | | |
|---|---|---|---|---|
| 5,821,168 A * | 10/1998 | Jain | ............................... | 438/692 |
| 2004/0026368 A1 * | 2/2004 | Barnes et al. | ................... | 216/60 |
| 2010/0081285 A1 * | 4/2010 | Chen et al. | .................... | 438/710 |
| 2010/0216310 A1 * | 8/2010 | Metz et al. | .................... | 438/694 |
| 2012/0329268 A1 * | 12/2012 | Soda | ................... | H01L 21/0337 |
| | | | | 438/631 |

FOREIGN PATENT DOCUMENTS

JP    2007-180358 A    7/2007

OTHER PUBLICATIONS

Anatech, Hummer 6.6 Sputter System—SEM Sample Preparation, Jan. 23, 2015, Anatechp.1-2.*
Whittaker, Interpreting Organic Spectra, The Royal Society of Chemistry, cover, copyright page, pertinant portion of Chapter 4 Ultraviolet Spectroscopy.*

* cited by examiner

*Primary Examiner* — Binh X Tran
*Assistant Examiner* — David Cathey, Jr.
(74) *Attorney, Agent, or Firm* — Rothwell, Figg, Ernst & Manbeck, P.C.

(57) ABSTRACT

Disclosed is a plasma etching method which suppresses the narrowing of the line-width of the line formed by etching and maintain the height of a remaining photoresist. The plasma etching method includes a modification process and an etching process. The modification process modifies a photoresist having a predetermined pattern by plasma of HBr/Ar gas while applying a negative DC voltage to an upper electrode containing silicon disposed to face a target object in which an organic film and the photoresist are sequentially laminated. The etching process etches the organic film by plasma of a processing gas which contains a CF-based gas and a CHF-based gas.

7 Claims, 7 Drawing Sheets

| | | Initial | HBr/Ar w DC | HBr/Ar w/o DC | H2/Ar w DC | H2/Ar w/o DC |
|---|---|---|---|---|---|---|
| After Cure | CROSS-SECTION | | | | | |
| | TOP SURFACE | | | | | |
| PR Height 1(nm) | | 75.4 | 60.8 | 62.4 | 53.6 | 60.5 |
| After SiARC Etch | CROSS-SECTION | | | | | |
| | TOP SURFACE | | | | | |
| PR Height 2(nm) | | 42.2 | 38.1 | 37.5 | 31.8 | 35.5 |
| PR Loss(nm) | | 33.2 | 22.7 | 24.9 | 21.8 | 25.0 |
| Line CD(nm) | | 41.5 | 44.7 | 42.3 | 41.2 | 38.0 |
| LWR/LER/SWR/SUM | | 3.6/2.4/3.6/9.6 | 2.2/1.4/2.2/5.7 | 2.4/1.7/2.4/6.5 | 2.1/1.5/2.0/5.6 | 2.7/1.9/2.6/7.2 |

FIG. 7

| | | HBr only w DC | HBr only w/o DC | HBr/He w DC | HBr/He w/o DC |
|---|---|---|---|---|---|
| After Cure | CROSS-SECTION | | | | |
| | TOP SURFACE | | | | |
| PR Height 1(nm) | | 70.4 | 72.1 | 67.9 | 70.2 |
| After SiARC Etch | CROSS-SECTION | | | | |
| | TOP SURFACE | | | | |
| PR Height 2(nm) | | 39.3 | 42.8 | 41.6 | 39.7 |
| PR Loss(nm) | | 31.1 | 29.3 | 26.3 | 30.5 |
| Line CD(nm) | | 45.5 | 44.2 | 43.7 | 43.6 |
| LWR/LER/SWR/SUM | | 2.6/1.7/2.7/7.0 | 2.7/1.8/2.6/7.1 | 2.4/1.7/2.5/6.7 | 2.4/1.7/2.6/6.7 |

FIG.8

| | Initial | HBr/Ar w DC | HBr/Ar w/o DC | H2/Ar w DC | H2/Ar w/o DC |
|---|---|---|---|---|---|
| After Cure CROSS-SECTION | | | | | |
| After Cure TOP SURFACE | | | | | |
| PR Height 1(nm) | 50.2 | 43.6 | 40.1 | 33.3 | 45.2 |
| After SiARC Etch CROSS-SECTION | | | | | |
| After SiARC Etch TOP SURFACE | | | | | |
| PR Height 2(nm) | 26.2 | 20.9 | 21.0 | 11.9 | 23.7 |
| PR Loss(nm) | 24.0 | 22.6 | 20.1 | 21.4 | 22.5 |
| Line CD(nm) | 29.0 | 29.1 | 28.3 | 28.8 | 26.7 |
| LWR/LER/SWR/SUM | 4.1/2.8/5.3/12.2 | 3.5/2.3/3.3/9.1 | 4.2/2.5/4.5/11.1 | 3.7/2.2/3.1/9.0 | 4.4/2.8/4.3/11.4 |

US 9,330,935 B2

PLASMA ETCHING METHOD AND PLASMA ETCHING APPARATUS

CROSS-REFERENCE TO RELATED APPLICATIONS

This application claims priority to U.S. Provisional Application 61/727,200, filed Nov. 16, 2012, and further claims priority to Japanese Application Number 2012-247782, filed Nov. 9, 2012, the entire contents of each of which are hereby incorporated by reference.

TECHNICAL FIELD

The present disclosure relates to various aspects and embodiments of a plasma etching method and a plasma etching apparatus.

BACKGROUND

A conventional plasma etching apparatus performs etching using a photoresist as a mask. There has been a method of depositing deposits on a surface of photoresist used as a mask by a plasma etching apparatus. For example, there is a method in which a silicon-containing deposit is deposited on a surface of a photoresist while applying a negative DC voltage to an upper electrode containing silicon.

See, for example, Japanese Patent Laid-Open No. 2007-180358.

However, in the conventional technology, when etching is performed using the photoresist in which the silicon-containing deposit is deposited as a mask, there is a problem that the width of a line formed by etching becomes narrowed and the height of the remaining photoresist is decreased.

SUMMARY

A plasma etching method according to one aspect of the present disclosure includes a modification process and an etching process. The modification process modifies a photoresist having a predetermined pattern by the plasma of HBr/Ar gas while applying a negative DC voltage to an upper electrode containing silicon disposed to face a target object in which an organic film and the photoresist are sequentially laminated. The etching process etches the organic film by the plasma of a processing gas using the modified photoresist as the mask.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, various embodiments will be described in detail with reference to the accompanying drawings. Additionally, the same or substantially the same portions are assigned the same reference numerals in the respective drawings.

A plasma etching method according to an exemplary embodiment of the present disclosure includes a modification process which modifies a photoresist having a predetermined pattern by the plasma of a HBr/Ar gas while applying a negative DC voltage to an upper electrode containing silicon disposed to face a target object in which an organic film and the photoresist are sequentially laminated, and an etching process which etches the organic film by the plasma of a processing gas which contains a CF-based gas and a CHF-based gas, using the modified photoresist as a mask.

Further, according to the plasma etching method of the present embodiment, the photoresist is an ArF resist formed by using an ArF excimer laser.

Further, according to the plasma etching method of the present embodiment, the photoresist is an EUV (Extreme Ultra-Violet) resist formed by using EUV light.

Further, according to the plasma etching method of the present embodiment, the CF-based gas is a CF4 gas and the CHF-based gas is a CHF3 gas.

Further, according to the plasma etching method of the present embodiment, the organic film is a Si-ARC film.

A plasma etching apparatus according to an exemplary embodiment of the present disclosure includes a processing chamber for performing a plasma etching process on a target object in which an organic film and a photoresist having a predetermined pattern are sequentially laminated; a depressurizing unit which reduces an internal pressure of the processing chamber; a gas supply unit which supplies a processing gas into the processing chamber; an upper electrode containing silicon disposed to face the target object; and a control unit which performs a modification process which modifies the photoresist by the plasma of a HBr/Ar gas while applying a negative DC voltage to the silicon-containing upper electrode, and an etching process which etches the organic film by a plasma of a processing gas which contains a CF-based gas and a CHF-based gas using the modified photoresist as a mask.

According to various aspects and embodiments of the present disclosure, a plasma etching method and a plasma etching apparatus are implemented that may suppress the narrowing of the line-width of a line formed by etching and maintain the height of the remaining photoresist.

Figure 1:
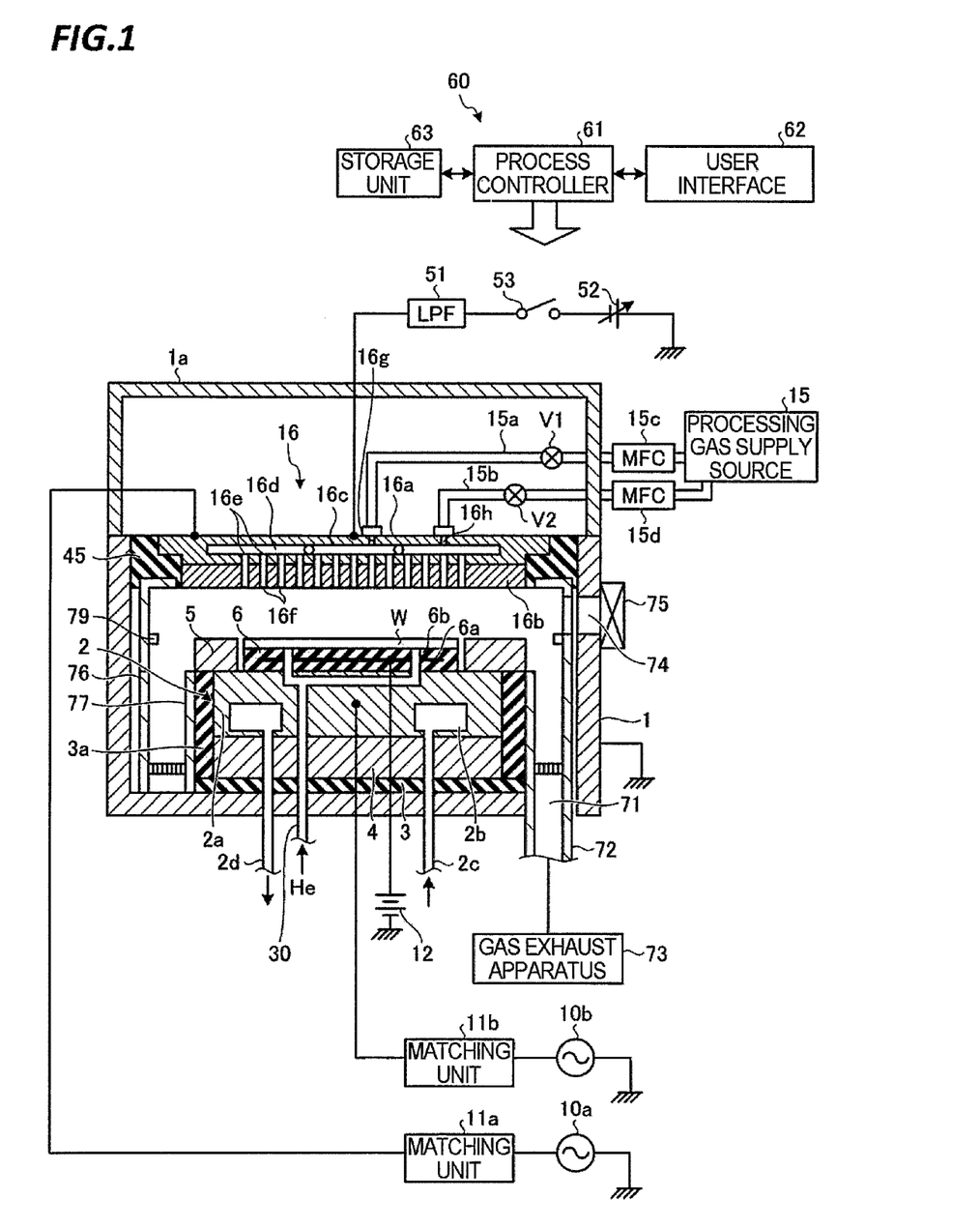
FIG. 1 is a schematic cross sectional view of a plasma etching apparatus applied to a plasma etching method according to an embodiment of the present disclosure.

FIG. 1 is a schematic cross sectional view illustrating a plasma etching apparatus applied to a plasma etching method according to the embodiment. The plasma etching apparatus illustrated in FIG. 1 includes a processing chamber 1 which is airtightly constructed and electrically grounded. The processing chamber 1 is formed in a cylindrical shape and configured by, for example, aluminum with an anodically oxidized film formed on the surface thereof. A mounting table 2 is provided in the processing chamber 1 for mounting a semiconductor wafer W, which is the target object, thereon in a horizontal direction.

The base material 2a of the mounting table 2 is made of a conductive metal such as, for example, aluminum, and the mounting table 2 serves as a lower electrode. The mounting table 2 is supported by a supporting table 4, which is a conductor, through the insulation plate 3. Further, a focus ring 5 made of, for example, a monocrystalline silicon is installed on the outer peripheral portion of upper side of the mounting table 2. Further, a cylindrical inner wall member 3a made of, for example quartz, is installed to surround the periphery of the mounting table 2 and the supporting table 4.

The shower head 16 serving as an upper electrode is arranged to face the mounting table 2 in parallel, that is, to face the semiconductor wafer W supported on the mounting table 2, is provided above the mounting table 2. The shower head 16 and the mounting table 2 are configured to serve as a pair of upper electrode and lower electrode. A first high frequency power source 10a is connected to the shower head 16 through a first matching unit 11a. Further, a second high frequency power source 10b is connected to the base material 2a of the mounting table 2 through a second matching unit 11b. The first high frequency power source 10a is for plasma generation, and a high frequency power of the predetermined frequency (e.g., 60 MHz) is supplied to the shower head 16 from the first high frequency power source 10a. Further, the second high frequency power source 10b is for ion attraction (biasing) and another high frequency power of a predetermined frequency (e.g., 13 MHz) lower than that of the first high frequency power source 10a is supplied to the base material 2a of the mounting table 2 from the second high frequency power source 10b.

An electrostatic chuck 6 which electrostatically attracts and holds the semiconductor wafer W is provided at the top surface of the mounting table 2. The electrostatic chuck 6 is configured such that an electrode 6a is interposed between insulators 6b, and the electrode 6a is connected with the DC power source 12. Also, the electrostatic chuck 6 is configured such that the DC voltage is applied to the electrode 6a from the DC power source 12, thereby attracting the semiconductor wafer W by a Coulomb's force.

A coolant flow path 2b is formed inside the mounting table 2 and is connected with a coolant inlet port pipe 2c and a coolant outlet port pipe 2d. Also, a coolant, such as Galden, is circulated in the coolant flow path 2b and thus, the supporting table 4 and the mounting table 2 may be controlled to a predetermined temperature. Further, a backside gas supply pipe 30 for supplying a cold-transferring gas (backside gas) such as a helium gas is installed at the rear side of the semiconductor wafer W to pass through, for example, the mounting table 2. The backside gas supply pipe 30 is connected to a backside gas supply source not illustrated. According to the configuration described above, the semiconductor wafer W attracted and held on the top surface of the mounting table 2 by the electrostatic chuck 6 may be controlled to a predetermined temperature.

The shower head 16 described above is installed on a ceiling-wall portion of the processing chamber 1. The shower head 16 is provided with a main body 16a and an upper-ceiling plate 16b which forms an electrode plate, and is supported on the top of the processing chamber 1 through the insulating member 45. The main body 16a is made of a conductive material such as, for example, aluminum of which the surface is anodically oxidized, and is configured such that the upper-ceiling 16b is detachably supported on the lower portion of the main body. The upper-ceiling 16b is made of, for example, a silicon-containing material, such as silicon.

The gas diffusion chambers 16c, 16d are provided within the main body 16a and a multiple of the gas-flow passage holes 16e are formed on the bottom portion of the main body 16a to be placed at a lower portion of the gas diffusion chambers 16c, 16d. The gas diffusion chamber is divided into two parts, that is, the gas diffusion chamber 16c provided at a central portion and a gas diffusion chamber 16d provided at a peripheral portion, and a supply state of the processing gas may be changed independently in the central portion and the peripheral portion.

Further, the gas introducing hole 16f is formed at the upper-ceiling 16b to be overlapped with the gas-flow passage hole 16e described above to pass through the upper-ceiling 16b in a thickness direction. With the configuration described above, the processing gas supplied to the gas diffusion chamber 16c, 16d is distributed into the processing chamber 1 in a shower fashion through the gas-flow passage hole 16e and the gas introduction hole 16f. Additionally, piping (not illustrated) for circulating the coolant is formed on, for example, the main body 16a and thus, the temperature of the shower head 16 may be controlled to a desired temperature during the plasma etching process.

Two gas introduction ports 16g, 16h for introducing the processing gas into the gas diffusion chambers 16c, 16d are formed in the main body 16a. One ends of the gas supply pipes 15a and 15b are connected to the gas introduction ports 16g and 16h, respectively, and the other ends of the gas supply pipes 15a and 15b are connected to the processing gas supply source 15 which supplies the processing gas for etching. The processing gas supply source 15 is an example of a gas supply unit. The gas supply pipe 15a is provided with a mass flow controller (MFC) 15c and an opening/closing valve V1 in this order from the upstream. Further, the gas supply pipe 15b is provided with a mass flow controller (MFC) 15d and an opening/closing valve V2 in this order from the upstream.

Also, the processing gas used for plasma etching is supplied to the gas diffusion chambers 16c, 16d through the gas supply pipes 15a, 15b from the processing gas supply source 15, and distributed into the processing chamber 1 in a shower fashion through the gas-flow passage hole 16e and the gas introduction hole 16f from the gas diffusion chambers 16c, 16d. For example, HBr/Ar gas used when modifying the photoresist is supplied from the processing gas supply source 15 to be described below. Further, for example, the processing gas which contains the CF-based gas and CHF-based gas used for etching the organic film is supplied from the processing gas supply source 15. Details of the gas supplied from the processing gas supply source 15 will be described below.

The variable DC power source 52 is electrically connected to the shower head 16 which serves as the upper electrode described above through a low pass filter (LPF) 51. Supply of power by the variable DC power source 52 may be controlled to be turned ON or OFF by an ON/OFF switch 53. The current or voltage to be output from the variable DC power source 52 and turning ON and OFF of the ON/OFF switch 53 are controlled by the control unit 60 to be described below. Additionally, as will be described below, when a high frequency wave is applied from the first high frequency power source 10a and the second high frequency power source 10b to the shower head 16 and the mounting table 2, respectively, and plasma is generated in the processing space, the ON/OFF switch 53 is turned ON by the control unit 60 as necessary and a predetermined DC voltage is applied to the shower head 16 serving as the upper electrode.

The grounding conductor 1a having a cylinder shape is provided to be extended more upward than the height position of the shower head 16 from a sidewall of the processing chamber 1. The cylindrical grounding conductor 1a has a top plate wall at its upper portion.

The gas exhaust port 71 is formed at the bottom portion of the processing chamber 1 and is connected with the gas exhaust apparatus 73 through the gas exhaust pipe 72. The gas exhaust apparatus 73 has a vacuum pump and the vacuum pump may be operated to reduce the internal pressure of the processing chamber 1 to a predetermined vacuum level. The gas exhaust apparatus 73 is an example of a depressurizing unit. In the meantime, the carry in/out port 74 of the semiconductor wafer W is formed at the sidewall of the processing chamber 1 and a gate valve 75 which opens and closes the carry in/out port 74 is provided thereon.

Reference numerals 76, 77 denote a deposition shield 76 which is detachable. The deposit shield 76 is provided along an inner wall of the processing chamber 1 and serves to prevent etching reaction products (deposits) from being attached to the processing chamber 1. The conductive member (GND block) 79 which is electrically grounded is provided at a position corresponding to the height position of the deposit shield 76 which is substantially the same position as that at which the semiconductor wafer W is placed, thereby preventing abnormal electrical discharge.

The overall operation of the plasma etching apparatus configured as described above is controlled by the control unit 60. The control unit 60 is provided with a process controller 61 which controls each part of the plasma etching apparatus equipped with a CPU, a user interface 62 and a storage unit 63.

The user interface 62 is configured by, for example, a keyboard with which an input manipulation is performed by a process manager and a display with which activation situation of the plasma etching apparatus is visualized to be displayed in order to manage the plasma etching apparatus.

The storage unit 63 stores a control program (software) for implementing various processes performed in the plasma etching apparatus under the control of process controller 61 or recipes in which the process condition data or the like are stored. Also, any recipe is retrieved and loaded from the storage unit 63 according to, for example, an instruction from the user interface 62 and is allowed to be executed by the process controller 61. And thus, a desired process is implemented in the plasma etching apparatus under the control of the process controller 61. Further, the control program or the recipe such as the process condition data stored in the computer readable recording medium (e.g., a hard disk, a CD, a flexible disk, a semiconductor memory) may be used, or the control program or the recipe such as the process condition data may be frequently transmitted from another apparatus, for example, through a dedicated line to be used online.

For example, the control unit 60 controls each part of the plasma etching apparatus to perform a plasma etching method to be described below. Specifically, the control unit 60 may modify the photoresist formed on the target object by the plasma of HBr/Ar while applying the negative DC voltage to the shower head 16 which serves as the upper electrode and etch the organic film of the target object by the plasma of the processing gas which contains CF-based gas and CHF-based gas using the modified photoresist as a mask. Details of the plasma etching method will be described later. Here, the target object is, for example, a semiconductor wafer W. Further, the photoresist may be an ArF resist formed by using an ArF excimer laser. Further, the photoresist is, for example, an Extreme Ultra-Violet (EUV) resist formed by using an EUV light. Further, the organic film is, for example, a silicon-containing anti reflection film (Si-ARC film).

Figure 2:
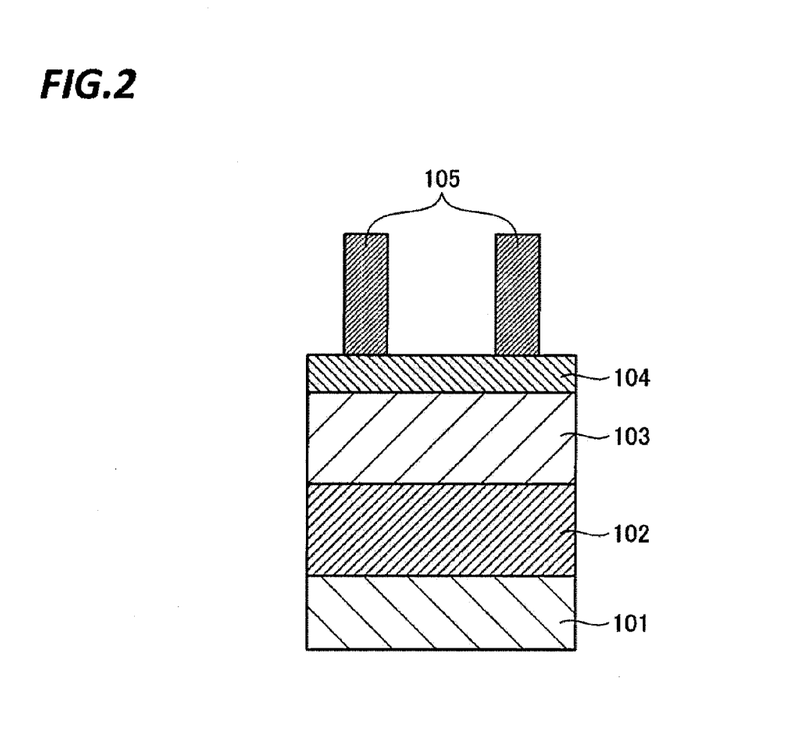
FIG. 2 is a cross sectional view of a first example of structure of a target object to be processed in the present embodiment.

FIG. 2 is a cross sectional view of a first example of structure of the target object of the present embodiment. The target object illustrated in FIG. 2 is formed by, for example, sequentially laminating a SiN film 102, an Organic Dielectric Layer (ODL) 103 and a Si-ARC film 104 on a Si substrate 101. Further, an ArF resist 105 having a predetermined pattern is formed above the Si-ARC film 104. The Si-ARC film 104 is an example of an organic film. The ArF resist 105 is an example of a photoresist. The ArF resist 105 has a polymer structure represented by the following chemical formula (1).

Figure 3:
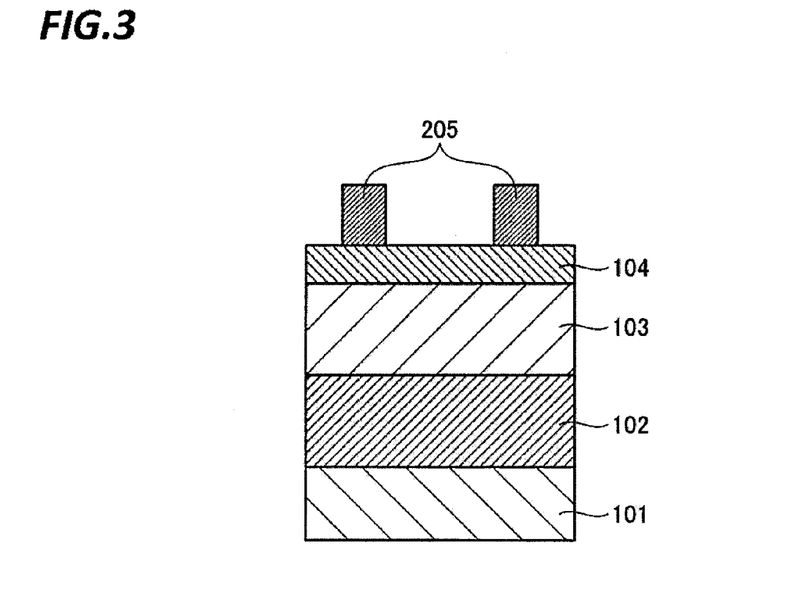
FIG. 3 is a cross sectional view of a second example of structure of the target object in the present embodiment.

FIG. 3 is a cross sectional view of a second example of structure of the target object of the present embodiment. The target object illustrated in FIG. 3 is formed by, for example, sequentially laminating the SiN film 102, the ODL 103 and the Si-ARC film 104 on the Si substrate 101. The SiN film 102, the ODL 103 and the Si-ARC film 104 are the same as the SiN film 102, the ODL 103 and the Si-ARC film 104 illustrated in FIG. 2. Also, an EUV resist 205 having a predetermined pattern is formed on the Si-ARC film 104. The height of the EUV resist 205 is lower than that of the ArF resist 105 illustrated in FIG. 2. For example, the height of the EUV resist 205 is 40 nm and the height of the ArF resist 105 is 80 nm. The Si-ARC film 104 is an example of an organic film. The EUV resist 205 is an example of a photoresist. The EUV resist 205 has a polymer structure represented by the following chemical formula (2). In the chemical formula (2), side chains R, R+ are adamantyl group and lactone group, respectively.

Subsequently, a processing sequence of the semiconductor wafer W to be subjected to a plasma processing by the plasma etching apparatus will be described. First, a gate valve 75 is opened, and the semiconductor wafer W is carried (loaded) into the processing chamber 1 from the carry in/out port 74 through a load lock chamber (not illustrated) to be mounted on the mounting table 2 by, for example, a conveyance robot (not illustrated). Then, the conveyance robot is retreated outside the processing chamber 1 and the gate valve 75 is closed. Also the inside of the processing chamber 1 is evacuated by the vacuum pump of the gas exhaust apparatus 73 through the gas exhaust port 71.

After the inside of the processing chamber 1 reaches a predetermined vacuum level, a predetermined processing gas (etching gas) is introduced into the processing chamber 1 from the processing gas supply source 15 and the internal pressure of the processing chamber 1 is maintained at a predetermined pressure. In this case, the amount of processing gas to be supplied to a central portion and a peripheral portion from the processing gas supply source 15 may be adjusted in a different level. Further, the ratio of the amount of gas supplied from the central portion to that supplied from the peripheral portion among the entire gas supply amount may be controlled to a desired value.

Also, in this situation, a high frequency power having a frequency of, for example, 60 MHz is supplied from the first high frequency power source 10a to the shower head 16. Further, the high frequency power (for biasing) having a frequency of, for example, 13 MHz is supplied from the second high frequency power source 10b to the base material 2a of the mounting table 2 for attracting ions. At this time, a predetermined DC voltage is applied from the DC power source 12 to the electrode 6a of the electrostatic chuck 6 and thus, the semiconductor wafer W is electrostatically attracted and held on the electrostatic chuck 6 by the Coulomb's force.

As described above, the high frequency power is supplied to the shower head 16 which is the upper electrode and the mounting table 2 which is the lower electrode and thus, an electric field is formed in a space between the shower head 16 and the mounting table 2. Electrical discharge is generated in the processing space in which the semiconductor wafer W exists and the semiconductor wafer W is undergone the plasma processing (e.g., etching process, modification process of the photoresist film) by the plasma of the processing gas generated by the electrical discharge.

Further, as described above, since a DC voltage may be applied to the shower head 16 during the plasma processing and the following effects may be obtained. That is, there may be a process which requires plasma having high electron density and low ion energy. In this case, when the DC voltage is used, electron density of the plasma is increased while the ion energy to be introduced to the semiconductor wafer W is suppressed. Therefore, a sputter rate for a film serving as a mask arranged above an object to be etched is decreased while the etching rate of a film which is the object to be etched is increased, thereby improving selectivity.

Also, when the plasma processing is completed, supplying of the high frequency power, the DC voltage and the processing gas are stopped, and the semiconductor wafer W is carried-out from the processing chamber 1 in an order which is reverse to the order described above.

Figure 4:
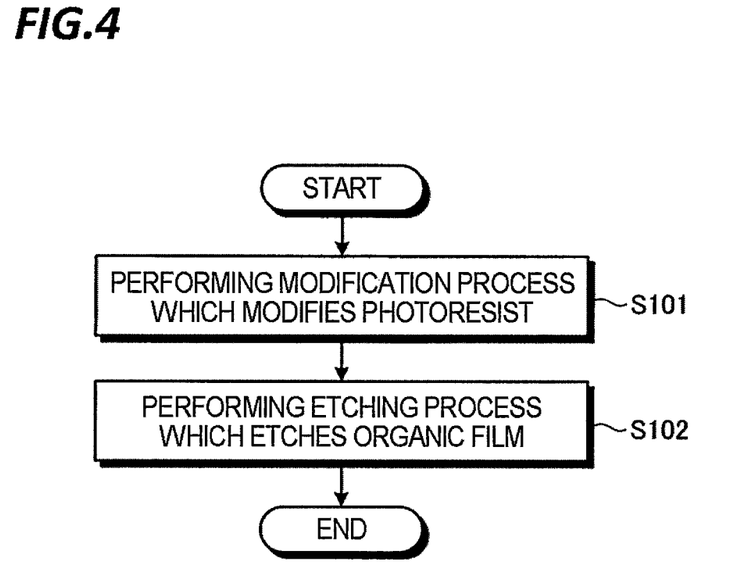
FIG. 4 is a flowchart illustrating an example of processing sequences of the plasma etching method by the plasma etching apparatus according to the present embodiment.

Subsequently, the plasma etching method by the plasma etching apparatus according to the present embodiment will be described in more detail. FIG. 4 is a flowchart illustrating an example of a process sequence of the plasma etching method by the plasma etching apparatus according to the present embodiment.

As illustrated in FIG. 4, the plasma etching apparatus performs a modification process in which the photoresist of the target object is modified by the plasma of HBr/Ar gas while applying the negative DC voltage to the upper electrode containing silicon (step S101). Specifically, the control unit 60 supplies HBr/Ar gas into the processing chamber 1 from the processing gas supply source 15 and generates the plasma of HBr/Ar gas while applying the negative DC voltage to the shower head 16 which is the upper electrode, thereby modifying the photoresist. Here, the modifying of the photoresist indicates performing at least one of (1) a smoothing process which smooths the surface of the photoresist, (2) a hardening process which hardens the photoresist, (3) a depositing process which deposits the deposits on the surface of the photoresist. Hereinafter, details of the smoothing process, hardening process and deposition process will be described sequentially.

Figure 5A:
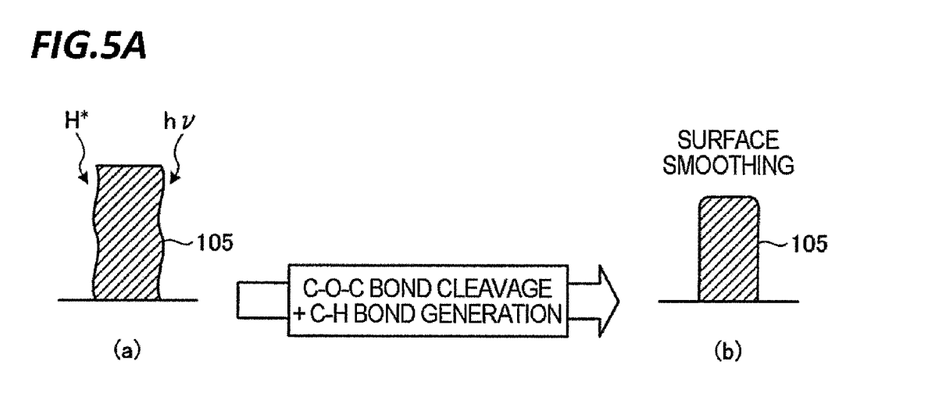
FIG. 5A is a view explaining a smoothing process of smoothing a surface of a photoresist.

FIG. 5A is a view explaining a smoothing process for smoothing the surface of the photoresist. In the example of FIG. 5A, the photoresist is assumed as the ArF resist 105 illustrated in FIG. 2. The control unit 60 introduces HBr/Ar gas into the processing chamber 1 from the shower head 16, and applies the negative DC voltage to the shower head 16 from the variable DC power source 52 while applying the high frequency power from the first high frequency power source 10a, thereby generating the plasma of HBr/Ar gas. Accordingly, as illustrated in (a) of FIG. 5A, hydrogen radical H* and light energy hv among the plasma of HBr/Ar gas are absorbed into the ArF resist 105 and a C—O—C bond included in the ArF resist 105 is cleaved and at the same time, the cleaved portion of the C—O—C bond is re-bonded with H and thus, the C—H bond is generated. In other words, the adamantyl group and the lactone group which are the side chains of the ArF resist 105 represented by the chemical formula (1) described above are left from the main chain. Then, the surface of the ArF resist 105 is smoothed out as illustrated in (b) of FIG. 5A. As a result, it is possible that a surface roughening of the ArF resist 105 is removed and the line-width narrowing of the line formed by etching is suppressed.

Additionally, although an example in which the photoresist is the ArF resist 105 is illustrated in FIG. 5A, the photoresist may be the EUV resist 205 illustrated in FIG. 3. In this case, when the plasma of HBr/Ar gas is generated, hydrogen radical H* and light energy hv among the plasma of HBr/Ar gas are absorbed into the EUV resist 205 and a C—O bond included in the EUV resist 205 is cleaved and at the same time, the cleaved portion of the C—O bond is re-bonded with H (hydrogen) and thus, the C—H bond is generated. In other words, the adamantyl group and the lactone group which are the side chains R, R+ of the EUV resist 205 represented by the chemical formula (2) described above are left from the main chain. Then, the surface of the EUV resist 205 is smoothed out. As a result, it is possible that a surface roughening of the EUV resist 205 is removed and the line-width narrowing of the line formed by etching is suppressed.

The ArF resist 105 or the EUV resist 205 which is the photoresist has a property of absorbing light having a wavelength of 150~460 nm. Therefore, the ArF resist 105 or the EUV resist 205 is easy to absorb light energy of the HBr plasma having a wavelength of, for example, 158 nm. That is, HBr/Ar is used and thus, light energy of the HBr plasma may be efficiently absorbed into the ArF resist 105 or the EUV resist 205 in the present embodiment. Therefore, it is possible to promote leaving of the adamantyl group and the lactone group.

Figure 5B:
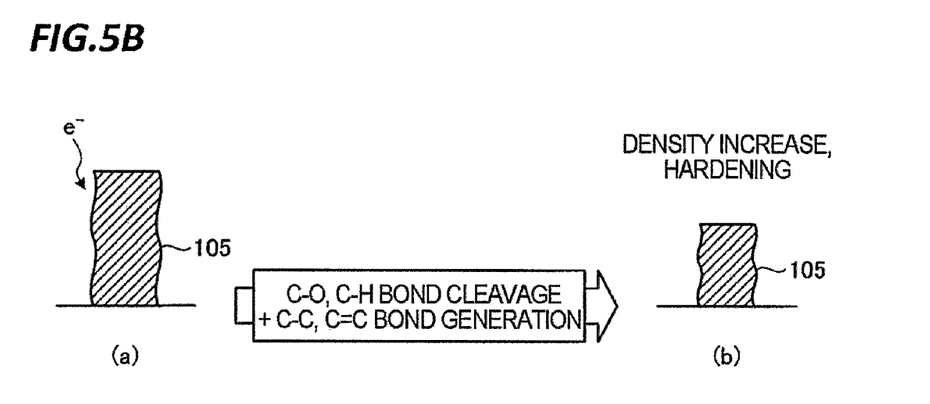
FIG. 5B is a view explaining a hardening process of hardening the photoresist surface.

FIG. 5B is a view explaining a hardening process of the photoresist surface. In the example of FIG. 5B, the photoresist is assumed as the ArF resist 105 illustrated in FIG. 2. The control unit 60 introduces HBr/Ar gas into the processing chamber 1 from the shower head 16 and the negative DC voltage is applied to the shower head 16 from the variable DC power source 52 while applying the high frequency power from the first high frequency power source 10a, thereby generating the plasma of HBr/Ar gas. That is, when the plasma of HBr/Ar gas plasma is formed, the control unit 60 applies the negative DC voltage from the variable DC power source 52 to the shower head 16 as a silicon-containing upper electrode. The control unit 60 may apply the negative DC voltage from the variable DC power source 52 to the shower head 16 such that an absolute value of a self-bias voltage of the surface of an upper upper-ceiling 16b, which is the surface of the shower head 16 as the silicon-containing upper electrode, becomes larger to a certain extent with which a predetermined sputter effect on the surface of the upper upper-ceiling 16b may be obtained. Accordingly, collision of Ar ions with respect to the surface of the upper-ceiling 16b is accelerated and as illustrated in (a) of FIG. 5B, the number of electrons e—falling down onto the ArF resist 105 from the upper-ceiling 16b increases and the C—O bond and the C—H bond contained in the ArF resist 105 are cleaved and at the same time, the cleaved portion is re-bonded with C (carbon) to generate a C—C bond and a C=C bond. That is, moisture is escaped from the ArF resist 105 represented by the chemical formula (1) described above and graphitization of the ArF resist 105 is progressed. Then, as illustrated in (b) of FIG. 5B, density of the ArF resist 105 is increased and the ArF resist 105 is hardened. As a result, it is possible that the resistance of the ArF resist 105 to the plasma is reinforced and the line-width narrowing of the line formed by etching is suppressed and further, the height of the photoresist remaining after etching may be maintained.

Although an example in which the photoresist is the ArF resist 105 is illustrated in FIG. 5B, the photoresist may be the EUV resist 205 illustrated in FIG. 3. In this case, when the negative DC voltage is applied to the shower head 16 from the variable DC power source 52 during the plasma of HBr/Ar gas is formed, the number of electrons e—which fall down from the surface of the upper-ceiling 16b onto the EUV resist 205 increases and thus, the C—O bond and the C—H bond contained in the EUV resist 205 are cleaved and at the same time, the cleaved portion is re-bonded with C (carbon) to generate the C—C bond and the C=C bond. That is, moisture is escaped from the EUV resist 205 represented by the chemical formula (2) described above and graphitization of the EUV resist 205 is progressed. Then, density of the EUV resist 205 is increased and the EUV resist 205 is hardened. As a result, it is possible that the resistance of the EUV resist 205 to the plasma is reinforced and the line-width narrowing of the line formed by etching is suppressed and further, the height of the photoresist remaining after etching may be maintained.

Figure 5C:
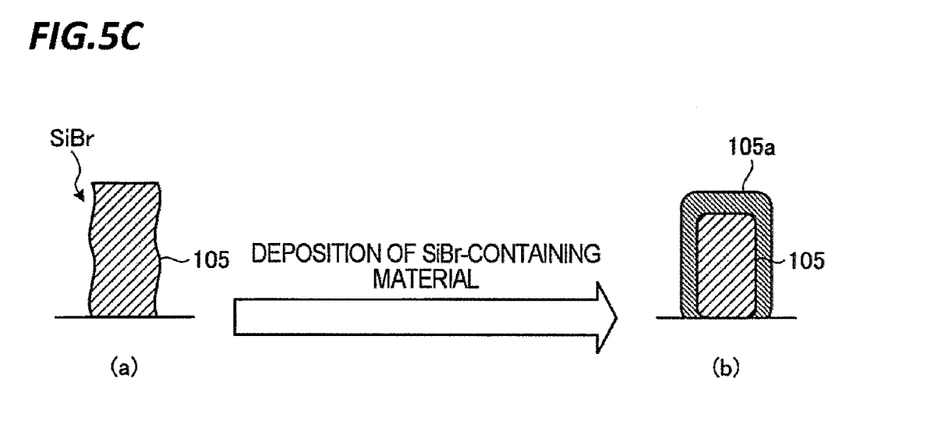
FIG. 5C is a view explaining a deposition process of depositing deposits on the photoresist surface.

FIG. 5C is a view explaining a deposition process of depositing deposits on the photoresist surface. In the example of FIG. 5C, the photoresist is assumed as the ArF resist 105 illustrated in FIG. 2. The control unit 60 introduces HBr/Ar gas into the processing chamber 1 from the shower head 16 and applies the negative DC voltage to the shower head 16 from the variable DC power source 52 while applying the high frequency power from the first high frequency power source 10a, thereby generating the plasma of HBr/Ar gas. That is, when the plasma of HBr/Ar gas plasma is formed, the control unit 60 applies the negative DC voltage to the shower head 16 serving as an upper electrode containing silicon from the variable DC power source 52. It is desirable that the control unit 60 applies the negative DC voltage from the variable DC power source 52 to the shower head 16 such that an absolute value of a self-bias voltage of the surface of an upper upper-ceiling 16b, which is a surface of the shower head 16 as the silicon-containing upper electrode, becomes larger to a certain extent with which a predetermined sputter effect on the surface of the upper upper-ceiling 16b may be obtained. Accordingly, collision of Ar ions with respect to the surface of the upper-ceiling 16b is accelerated and the amount of silicon contained in the shower head 16 that fall down is increased and thus, SiBr obtained by the reaction of Si with Br contained in HBr/Ar gas falls down onto the ArF resist 105 as illustrated in (a) of FIG. 5C. Then, a SiBr-containing material 105a is deposited on the surface of the ArF resist 105 as illustrated in (b) of FIG. 5C. As a result, it is possible that the resistance of the ArF resist 105 to the plasma is reinforced while improving the surface roughness of the ArF resist 105, and thus, the line-width narrowing of the line formed by etching is suppressed and further, the height of the photoresist remaining after etching may be maintained.

Referring back to FIG. 4, after the modification process, the plasma etching apparatus performs the etching process which etches the organic film by the plasma of the processing gas which contains CF-based gas and CHF-based gas using the modified photoresist as a mask (step S102). Specifically, the control unit 60 supplies the processing gas which contains CF-based gas and CHF-based gas from the processing gas supply source 15 into the processing chamber 1, and generates the plasma of the processing gas while applying the negative DC voltage to the shower head 16 which is the upper electrode, thereby etching the organic film. Here, the CF-based gas is, for example, CF4 gas and CHF-based gas is, for example, CHF3 gas.

Description will be made using a more specific example. The control unit 60 introduces the processing gas which contains CF-based gas and CHF-based gas from the shower head 16 into the processing chamber 1, and applies the high frequency power for ion attraction from the second high frequency power source 10b while applying the high frequency power from the first high frequency power source 10a, thereby etching the organic film.

As described above, according to the present embodiment, the photoresist is modified by the plasma of HBr/Ar gas while the negative DC voltage is applied to the upper electrode containing silicon disposed to face the target object. The organic film of the target object is etched by the plasma of the processing gas which contains CF-based gas and CHF-based gas using the modified photoresist as the mask. Therefore, according to the present embodiment, it is possible to reinforce the resistance of the photoresist to the plasma while improving the surface roughness of the photoresist. As a result, it is possible to suppress the narrowing of the line-width of the line formed by etching and maintain the height of the photoresist remaining after completion of etching.

Further, according to the present embodiment, the photoresist is the ArF resist 105. As a result, it is possible to suppress the narrowing of the line-width of the line formed by etching and maintain the height of the ArF resist 105 remaining after completion of etching.

Further, according to the present embodiment, the photoresist is the EUV resist 205. As a result, it is possible to suppress the narrowing of the line-width of the line formed by etching and maintain the height of the EUV resist 205 remaining after completion of etching.

The plasma etching method of the present embodiment will be described hereinafter using an embodiment in more detail. However, the plasma etching method of the present embodiment is not limited to the embodiment to be described below.

Comparative Example 1

An etching process was performed on the target object in the comparative example 1. The target object having a structure described in the following was used. The following conditions have been used as the etching process condition.
(Target Object)
Organic film: Si-ARC film
Photoresist: ArF resist
(Etching Process)
Processing gas: CF4/CHF3/O2=150/75/5 sccm
Pressure: 1.3 Pa (10 mTorr)
High frequency power from first high frequency power source: 500 W
High frequency power from second high frequency power source: 50 W
DC voltage to upper electrode: 0 V Embodiment 1

A modification process was performed and thereafter, an etching process was performed on the target object in the embodiment 1. The same target object as that of the comparative example 1 was used. The etching process was performed under the same condition as that of the comparative example 1. The following conditions were used as the modification process.
(Modification Process)
Processing gas: HBr/Ar=100/800 sccm
Pressure: 6.7 Pa (50 mTorr)
High frequency power from first high frequency power source: 300 W
High frequency power from second high frequency power: 0 W
DC voltage to upper electrode: −900 V Comparative Example 2

DC voltage to be applied to an upper electrode in the modification process of the embodiment 1 was set to zero (0) V in the comparative example 2. Other conditions were the same as those of the embodiment 1.

Comparative Example 3

H2/Ar=100/800 sccm was used as a processing gas and a flow rate of the processing gas, respectively, in the modification process of the embodiment 1 in the comparative example 3. Other conditions are the same as those of the embodiment 1.

Comparative Example 4

DC voltage to be applied to an upper electrode was set to 0V, H2/Ar=100/800 sccm was used as a processing gas and a flow rate of the processing gas, respectively, in the modification process of the embodiment 1 in the comparative example 4. Other conditions are the same as those of the embodiment 1.

Figure 6:
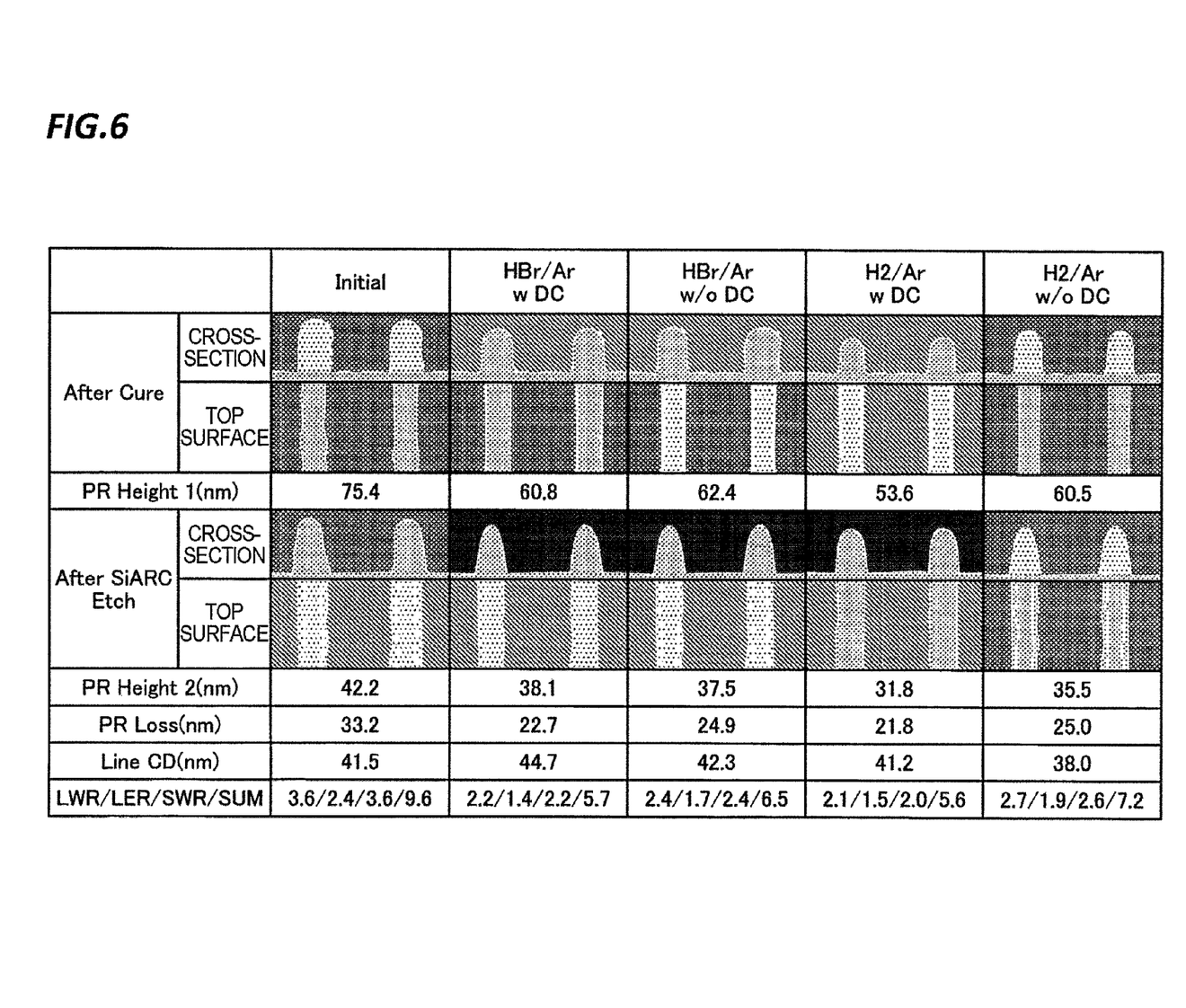
FIG. 6 is a view illustrating the result of the process performed in comparative examples 1~4 and an embodiment 1.

FIG. 6 is a view illustrating a result of a process performed in the comparative examples 1~4 and the embodiment 1. In FIG. 6, "Initial" indicates the shape of the target object after the respective processes are completed in the comparative example 1. "HBr/Ar w DC" indicates the shape of the target object after the etching process is completed in the embodiment 1. "HBr/Ar w/o DC" indicates the shape of the target object after the respective processes are completed in the comparative example 2. "H2/Ar w DC" indicates the shape of the target object after the respective processes are completed in the comparative example 3. "H2/Ar w/o DC" indicates the shape of the target object after the respective processes are completed in the comparative example 4.

Further, "After Cure cross-section" in FIG. 6 indicates a traced figure of a photograph obtained by enlarging the cross section of the target object after the modification process is completed in the embodiment 1 and the comparative examples 2~4, and "After Cure top surface" is a traced figure of a photograph obtained by enlarging the top surface of the target object after the modification process is completed in the embodiment 1 and the comparative examples 2~4. In the meantime, "After Cure cross-section" and "After Cure top surface" corresponding to the "Initial" are traced figures of the photographs obtained by enlarging the cross section and the top surface of the target object, respectively, before the target object is processed.

Further, "After SiARC Etch cross-section" in FIG. 6 indicates a traced figure of a photograph obtained by enlarging a cross-section of the target object after the etching process is completed in the embodiment 1 and the comparative examples 1~4 and "After SiARC Etch top surface" is a traced figure of a photograph obtained by enlarging a top surface of the target object after the etching process is completed in the embodiment 1 and the comparative examples 1~4.

Further, "PR Height 1" which is the height of a photoresist remaining after the modification process is completed in the embodiment 1 and the comparative examples 2~4 is also indicated in FIG. 6. Additionally, "PR Height 1" corresponding to "Initial" is the height of the photoresist formed on the target object which is not yet processed. Further, "PR Height 2" which is the height of the photoresist remaining after the etching process is completed in the embodiment 1 and the comparative examples 1~4, is also indicated in FIG. 6. Further, "PR Loss" which is the difference between "PR Height 1" and "PR Height 2" is also indicated in FIG. 6. Further, "Line CD" which is the width of a line (photoresist) after the etching process is completed in the embodiment 1 and the comparative examples 1~4, is also indicated in FIG. 6. Further, LWR (Line Width Roughness), SWR (Space Width Roughness) and LER (Line Edge Roughness) as well as "SUM" which is the value of the sum of the LWR, SWR and LER are also indicated in FIG. 6. Further the LWR, the SWR, the LER and the SUM each indicates non-uniformity degree of the line, and indicates that roughness of the line becomes smaller as each value of the LWR, the SWR, the LER and the SUM becomes smaller.

As illustrated in FIG. 6, as compared to the comparative example 1 in which the modification process was not performed, the Line CD became larger as well as the LWR, the LER, the SWR and the SUM became smaller in the embodiment 1 in which the modification process was performed. Further, it was possible to maintain the "PR Height 2" in the same level as that in the comparative example 1 in the embodiment 1 in which the modification process was performed. That is, in the embodiment 1, it was possible to suppress the narrowing of the line-width of the line formed by etching and maintain the height of the remaining photoresist as compared to the comparative example 1. Further, in the embodiment 1, it was possible to make the roughness of the line formed by etching smaller as compared to the comparative example 1.

Further, in the embodiment 1, the negative DC voltage is applied to the upper electrode and thus, it is possible to obtain an optimal LWR, LER, SWR and SUM while maintaining the line width and the photoresist height at a large value as compared to the comparative example 2 in which the DC voltage is not applied to the upper electrode.

Further, in the embodiment 1, HBr/Ar gas is used and thus, it is possible to obtain an optimal LWR, LER, SWR and SUM while maintaining the line width and the photoresist height at a large value as compared to the comparative example 3 in which the H2/Ar gas is used.

Further, in the embodiment 1, the negative DC voltage is applied to the upper electrode as well as HBr/Ar gas is used and thus, it is possible to obtain an optimal LWR, LER, SWR and SUM while maintaining the line width and the photoresist height at a large value as compared to the comparative example 4 in which the DC voltage is not applied to the upper electrode as well as the H2/Ar gas is used.

Comparative Example 5

HBr=100 sccm was used as a processing gas and a flow rate of the processing gas, respectively, in the modification process of the embodiment 1 in the comparative example 5. Other conditions were the same as those of the embodiment 1.

Comparative Example 6

DC voltage to be applied to an upper electrode was set to zero (0) V and HBr=100 sccm was used as a processing gas and a flow rate of the processing gas, respectively, in the modification process of the embodiment 1 in the comparative example 6. Other conditions were the same as those of the embodiment 1.

Comparative Example 7

HBr/He=100/800 sccm was used as a processing gas and a flow rate of the processing gas, respectively, in the modification process of the embodiment 1 in the comparative example 7. Other conditions were the same as those of the embodiment 1.

Comparative Example 8

DC voltage to be applied to an upper electrode was set to 0V, and HBr/He=100/800 sccm was used as a processing gas and the flow rate of the processing gas, respectively, in the modification process of the embodiment 1 in the comparative example 8. Other conditions are the same as those of the embodiment 1.

Figure 7:
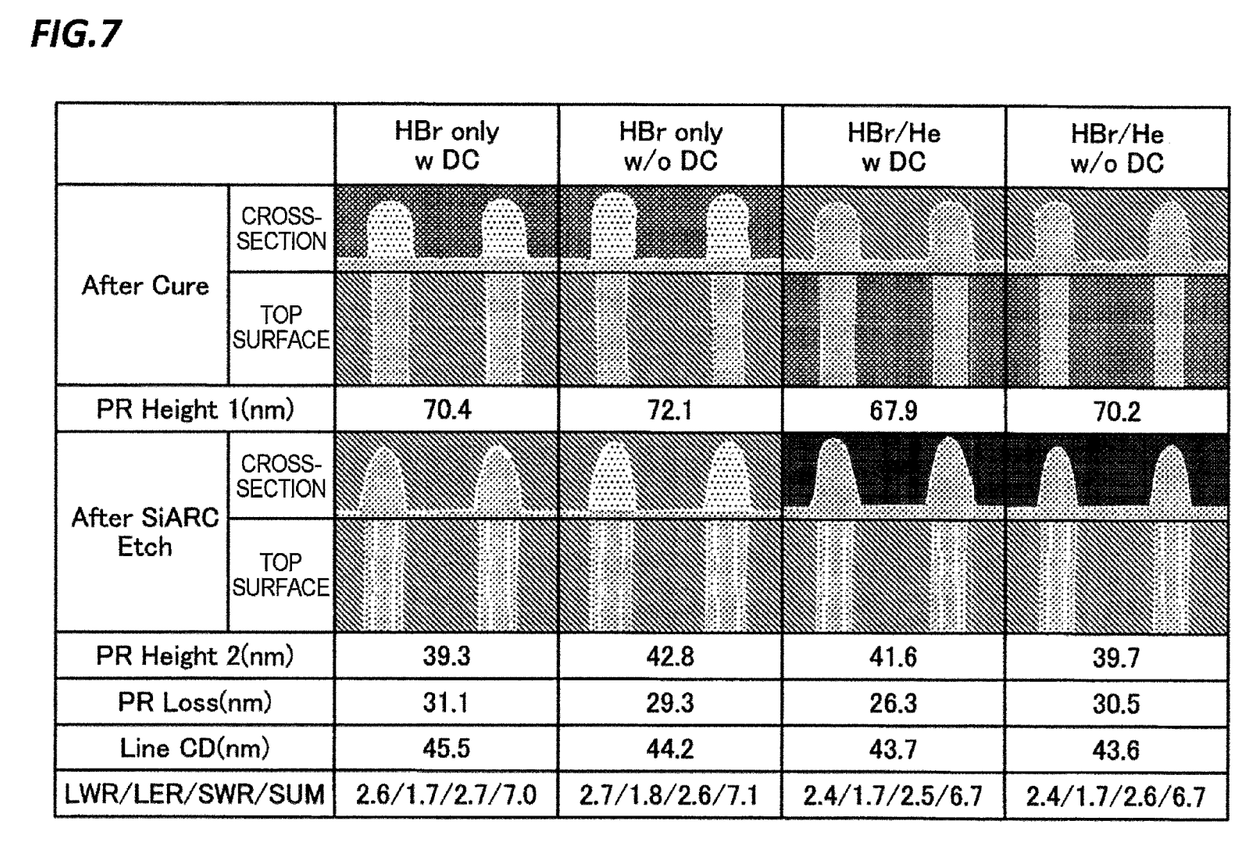
FIG. 7 is a view illustrating the result of the process performed in comparative examples 5~8.

FIG. 7 is a view illustrating a result of a process performed in the comparative examples 5~8. In FIG. 7, "HBr only w DC" indicates the shape of the target object after the respective processes are completed in the comparative example 5. "HBr only w/o DC" indicates the shape of the target object after the respective processes are completed in the comparative example 6. "HBr/He w DC" indicates the shape of the target object after the respective processes are completed in the comparative example 7. "HBr/He w/o DC" indicates the shape of the target object after the respective processes are completed in the comparative example 8.

Further, "After Cure cross-section" in FIG. 7 indicates a traced figure of a photograph obtained by enlarging the cross section of the target object after the modification process is completed in the comparative examples 5~8, and "After Cure top surface" is a traced figure of a photograph obtained by enlarging the top surface of the target object after the modification process is completed in the comparative examples 5~8. Further, "After SiARC Etch cross-section" in FIG. 7 indicates a traced figure of a photograph obtained by enlarging the cross-section of the target object after the etching process is completed in the comparative examples 5~8 and "After SiARC Etch top surface" is a traced figure of a photograph obtained by enlarging the top surface of the target object after the etching process is completed in the comparative examples 5~8.

Further, "PR Height 1" which is the height of a photoresist remaining after the modification process, is completed in the comparative examples 5~8 is also indicated in FIG. 7. Further, "PR Height 2" which is the height of a photoresist remaining after the etching process is completed in the comparative examples 5~8, is also indicated in FIG. 7. Further, "PR Loss" which is a difference between "PR Height 1" and "PR Height 2", is also indicated in FIG. 7. Further, "Line CD" which is the width of a line (photoresist) after the etching process is completed in the comparative examples 5~8, is also indicated in FIG. 7. Further, the LWR, the SWR and the LER as well as "SUM" which is a value of the sum of the LWR, SWR and LER, are also indicated in FIG. 7.

As illustrated in FIG. 6 and FIG. 7, in the embodiment 1, HBr/Ar is used and thus, it is possible to obtain an optimum LWR, LER, SWR and SUM while maintaining the line width and the photoresist height at equivalent values to those in the comparative example 5 in which only HBr is used. It is considered that the effect described above may be obtained because collision of the Ar ion onto the surface of the upper electrode containing silicon is accelerated to obtain a predetermined sputtering effect, such that the SiBr-containing material is stably deposited on the surface of photoresist.

Further, in the embodiment 1, the negative DC voltage is applied to the upper electrode as well as HBr/Ar is used and thus, it is possible to obtain an optimal LWR, LER, SWR and SUM while maintaining the line width and the photoresist height at equivalent values to those in the comparative example 6 in which the DC voltage is not applied to the upper electrode and only HBr is used.

Further, in the embodiment 1, HBr/Ar is used and thus, it is possible to obtain an optimum LWR, LER, SWR and SUM while maintaining the line width and the photoresist height at equivalent values to those in the comparative example 7 in which HBr/He is used. It is considered that the effect described above may be obtained because argon (Ar) having ionization energy lower than that of helium (He) is more easily ionized than He to accelerate collision of the Ar ions onto the surface of the silicon-containing upper electrode to obtain a predetermined sputtering effect, such that the SiBr-containing material is stably deposited on the surface of the photoresist.

Further, in the embodiment 1, the negative DC voltage is applied to the upper electrode as well as HBr/Ar gas is used and thus, it is possible to obtain an optimal LWR, LER, SWR and SUM while maintaining the line width and the photoresist height at equivalent values to those in the comparative example 8 in which the negative DC voltage is not applied to the upper electrode as well as HBr/He gas is used.

Comparative Example 9

An etching process is performed on the target object in the comparative example 9. The target object having a structure described in the following is used. The etching process was performed under the same condition as that of the comparative example 1.

(Target Object)
Organic film: Si-ARC film
Photoresist: EUV resist

Embodiment 2

A modification process was performed and thereafter, an etching process was performed on the target object in the embodiment 2. The same target object as that of the comparative example 9 has been used. The etching process was performed under the same condition as that of the comparative example 1. The following conditions were used as the modification process.

(Modification Process)
Processing gas: HBr/Ar=100/800 sccm
Pressure: 6.7 Pa (50 mTorr)
High frequency power from first high frequency power source: 300 W
High frequency power from second high frequency power: 0 W
DC voltage to upper electrode: −900 V Comparative Example 10

DC voltage to be applied to an upper electrode in the modification process of the embodiment 2 was set to zero (0) V in the comparative example 10. Other matters are the same as those of the embodiment 2.

Comparative Example 11

H2/Ar=100/800 sccm was used as a processing gas and a flow rate of the processing gas, respectively, in the modification process of the embodiment 2 in the comparative example 11. Other conditions are the same as those of the embodiment 2.

Comparative Example 12

DC voltage to be applied to an upper electrode was set to zero (0) V, H2/Ar=100/800 sccm was used as a processing gas and a flow rate of the processing gas, respectively, in the modification process of the embodiment 2 in the comparative example 12. Other conditions are the same as those of the embodiment 2.

Figure 8:
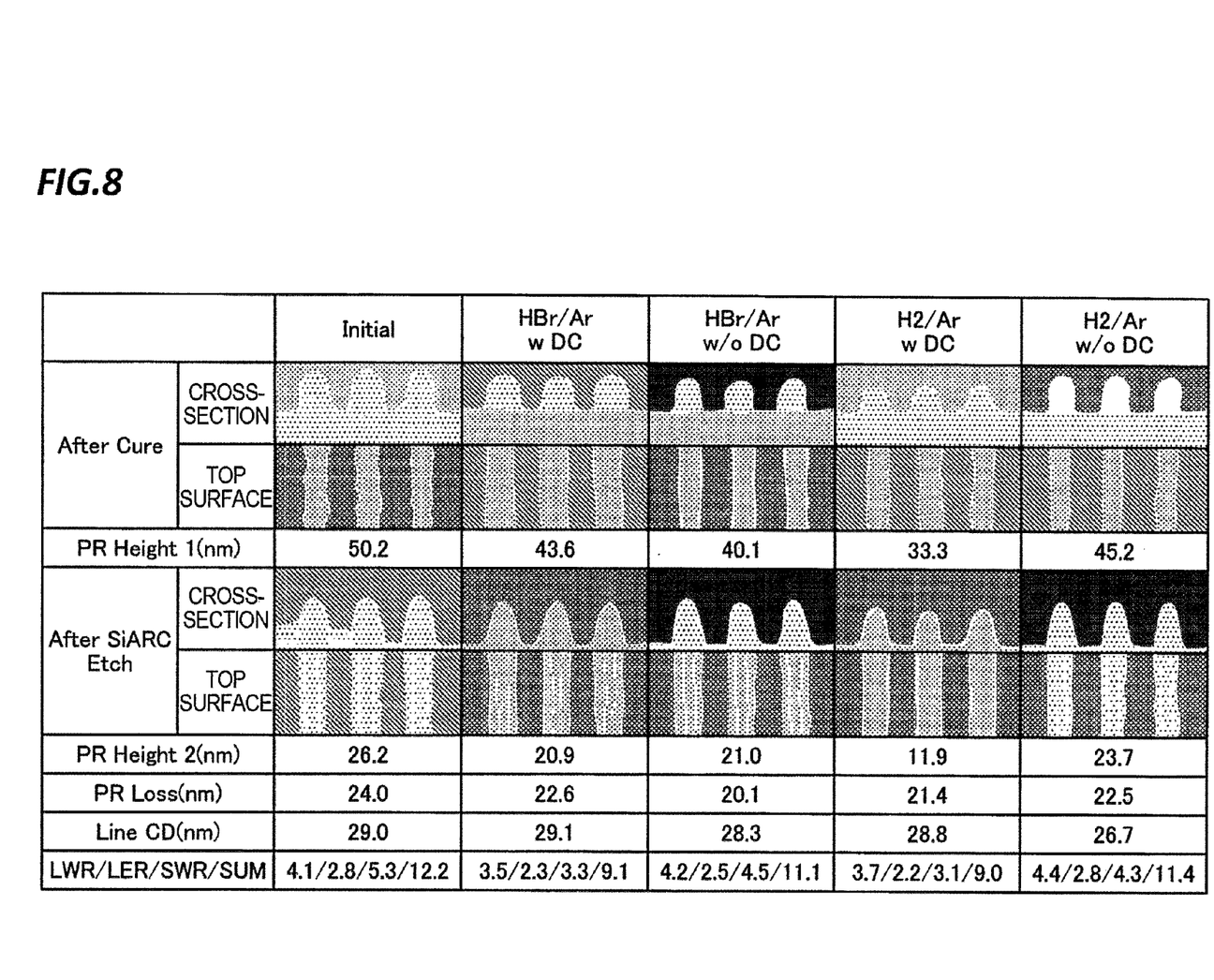
FIG. 8 is a view illustrating the result of the process performed in comparative examples 9~12 and an embodiment 2.

FIG. 8 is a view illustrating a result of a process performed in the comparative examples 9~12 and the embodiment 2. In FIG. 8, "Initial" indicates the shape of the target object after the etching process is completed in the comparative example 9. "HBr/Ar w DC" indicates the shape of the target object after the respective processes are completed in the embodiment 2. "HBr/Ar w/o DC" indicates the shape of the target object after the respective processes are completed in the comparative example 10. "H2/Ar w DC" indicates the shape of the target object after the respective processes are completed in the comparative example 11. "H2/Ar w/o DC" indicates the shape of the target object after the respective processes are completed in the comparative example 12.

Further, "After Cure cross-section" in FIG. 8 indicates a traced figure of a photograph obtained by enlarging a cross section of the target object after the modification process is completed in the embodiment 2 and the comparative examples 10~12, and "After Cure top surface" is a traced figure of a photograph obtained by enlarging the top surface of the target object after the modification process is completed in the embodiment 2 and the comparative examples 10~12. In the meantime, "After Cure cross-section" and "After Cure top surface" corresponding to the "Initial" are traced figures of the photographs obtained by enlarging the cross section and the top surface of the target object, respectively, before the target object is processed.

Further, "After SiARC Etch cross-section" in FIG. 8 indicates a traced figure of a photograph obtained by enlarging the cross-section of the target object after the etching process is completed in the embodiment 2 and the comparative examples 9~12 and "After SiARC Etch top surface" is a traced figure of a photograph obtained by enlarging the top surface of the target object after the etching process is completed in the embodiment 2 and the comparative examples 9~12.

Further, "PR Height 1" which is a height of a photoresist remaining after the modification process is completed in the embodiment 2 and the comparative examples 10~12, is also indicated in FIG. 8. Additionally, "PR Height 1" corresponding to "Initial" is the height of the photoresist formed on the target object which is not yet processed. Further, "PR Height 2" which is the height of a photoresist remaining after the etching process is completed in the embodiment 2 and the comparative examples 9~12, is also indicated in FIG. 8. Further, "PR Loss" which is a difference between "PR Height 1" and "PR Height 2" is also indicated in FIG. 8. Further, "Line CD" which is a width of a line (photoresist) after the etching process is completed in the embodiment 2 and the comparative examples 9~12, is also indicated in FIG. 8. Further, the LWR, the SWR and the LER as well as "SUM" which is a value of the sum of the LWR, SWR and LER, are also indicated in FIG. 8.

As illustrated in FIG. 8, as compared to the comparative example 9 in which the modification process is not performed, the Line CD became larger as well as the LWR, the LER, the SWR and the SUM became smaller in the embodiment 2 in which the modification process is performed. Further, it was possible to maintain the "PR Height 2" in the same level as that in the comparative example 9 in the embodiment 2 in which the modification process is performed. That is, in the embodiment 2, it was possible to suppress the narrowing of the line-width of the line formed by etching and maintain the height of the remaining photoresist as compared to the comparative example 9. Further, in the embodiment 2, it was possible to make the roughness of the line formed by etching smaller compared to the comparative example 9.

Further, in the embodiment 2, the negative DC voltage is applied to the upper electrode and thus, it is possible to obtain an optimal LWR, LER, SWR and SUM while maintaining the line width and the photoresist height at a large value as compared to the comparative example 10 in which the DC voltage is not applied to the upper electrode.

Further, in the embodiment 2, HBr/Ar gas is used and thus, it is possible to obtain an optimal LWR, LER, SWR and SUM while maintaining the line width and the photoresist height at a large value as compared to the comparative example 11 in which H2/Ar gas is used.

Further, in the embodiment 2, the negative DC voltage is applied to the upper electrode as well as HBr/Ar gas is used and thus, it is possible to obtain an optimal LWR, LER, SWR and SUM while maintaining the line width and the photoresist height at a large value as compared to the comparative example 12 in which the DC voltage is not applied to the upper electrode as well as H2/Ar gas is used.

As described above, the etching process is performed after the modification process and thus, it is possible to improve the surface roughness of the photoresist serving as the mask as well as reinforce the resistance of the photoresist to the plasma. As a result, even if the etching is continued, in a case where the etching process is performed after the modification process, it is possible to suppress the narrowing of the linewidth of the line formed by etching and maintain the height of the photoresist remaining after etching as compared to a case where the modification is not performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma etching method comprising:
providing a target object on a mounting table serving as a lower electrode, the target object being sequentially laminated with an organic film and a photoresist, the photoresist being one of an ArF resist and an Extreme Ultra-Violet (EUV) resist and having a predetermined pattern;
applying plasma of HBr/Ar gas to a surface of the photoresist while introducing the HBr/Ar gas into a processing chamber and applying a first high frequency power and a negative DC voltage a shower head serving as to an upper electrode containing silicon disposed to face the target object without applying a second high frequency power having a frequency lower than that of the first high frequency power to the lower electrode in order to perform at least one of:
(i) smoothing the surface of the photoresist by allowing the surface of the photoresist to absorb both hydrogen radicals and light energy from the plasma of HBr/Ar gas,
(ii) hardening the surface of the photoresist by irradiating electrons from the upper electrode supplied with the negative DC voltage to the surface of the photoresist, and
(iii) depositing SiBr-containing material on the surface of the photoresist from the plasma of HBr/Ar gas and the upper electrode supplied with the negative DC voltage, thereby reinforcing resistance of the photoresist to the plasma and improving a surface roughness of the photoresist; and
using the photoresist where the resistance to the plasma is reinforced and the surface roughness is improved at the applying, etching the organic film by plasma of a processing gas which contains a CF-based gas and a CHF-based gas.

2. The plasma etching method according to claim 1, wherein the ArF resist is formed by using an ArF excimer laser and has a property of absorbing light with a wavelength ranging from 150 nm to 160 nm.

3. The plasma etching method according to claim 1, wherein the Extreme Ultra-Violet (EUV) resist is formed by using EUV light and has a property of absorbing light with a wavelength ranging from 150 nm to 160 nm.

4. The plasma etching method according to claim 1, wherein the CF-based gas is a $CF_4$ gas and the CHF-based gas is a $CHF_3$ gas.

5. The plasma etching method according to claim 1, wherein the organic film is a Si-ARC film.

6. The plasma etching method according to claim 1, wherein the negative DC voltage applied to the upper electrode is in an amount of −900 V.

7. The plasma etching method according to claim 6, wherein the ratio of the HBr gas to the Ar gas is 100 to 800 sccm.

* * * * *